United States Patent [19]
Koh et al.

[11] Patent Number: 4,609,568
[45] Date of Patent: Sep. 2, 1986

[54] SELF-ALIGNED METAL SILICIDE PROCESS FOR INTEGRATED CIRCUITS HAVING SELF-ALIGNED POLYCRYSTALLINE SILICON ELECTRODES

[75] Inventors: Yun Bai Koh, Sunnyvale; Frank Chien, Los Altos; Madhu Vora, Los Gatos, all of Calif.

[73] Assignee: Fairchild Camera & Instrument Corporation, Mountain View, Calif.

[21] Appl. No.: 634,936

[22] Filed: Jul. 27, 1984

[51] Int. Cl.$^4$ .............................................. H01L 21/20
[52] U.S. Cl. ........................................ 427/85; 427/88; 427/93; 427/94
[58] Field of Search .................. 427/85, 88, 93, 94; 148/DIG. 19, DIG. 147

[56] References Cited

U.S. PATENT DOCUMENTS

| | | | |
|---|---|---|---|
| 4,080,719 | 3/1978 | Wilting | 29/571 |
| 4,124,934 | 11/1978 | De Brebisson | 29/590 |
| 4,249,968 | 2/1981 | Gardiner et al. | 148/174 |

FOREIGN PATENT DOCUMENTS 46371 2/1982 European Pat. Off. .............. 427/93

OTHER PUBLICATIONS

"Self-Aligned Titanium Silicidation of Submicron Most Devices by Rapid Lamp Annealing," K. Tsukamoto et al., CH2099-0/84/0000-0130 I.E.D.M., 1984, pp. 130-133.
"Development of the Self-Aligned Titanium Silicide Process for VLSI Applications," M. E. Alperin, et al., 0018-9383/85/0200-0141 I.E.E.E., 1985, pp. 141-149.
"An Advanced PSY Process for High Speed Bipolar VLSI," I. Ishada, et al., CH1504-0'79 0000-0336, I.E.E.E., 1979, pp. 336-339.
"A High Performance CMOS Technology With Ti--Silicided P/N-Type Poly-Si Gates," Y. Murao, et al., CH1973-7/83/0000-0518 I.E.E.E., 1983, pp. 518-521.
"Titanium Disilicide Self-Aligned Source/Drain+-Gate Technology," C. K. Lau, et al., CH1832-5/82/00-00-0714, IEEE, 1982, pp. 714-717.

*Primary Examiner*—John D. Smith
*Assistant Examiner*—K. Jaconetty
*Attorney, Agent, or Firm*—Carl L. Silverman; David H. Carroll; Robert C. Colwell

[57] ABSTRACT

A process for fabricating self-aligned regions of metal silicide on bipolar integrated circuits having self-aligned polycrystalline silicon emitters and base contacts includes the steps of depositing a layer of polycrystalline silicon across the surface of the structure, patterning the polycrystalline silicon to define the emitters and base contacts as well as resistors and diodes, heating the structure to transfer desired conductivity dopants from the polycrystalline silicon into the underlying structure, forming a protective layer over those regions of the structure where metal silicide is not desired, depositing a layer of refractory metal across the entire structure, and reacting the refractory metal with the underlying silicon to form metal silicide.

8 Claims, 7 Drawing Figures

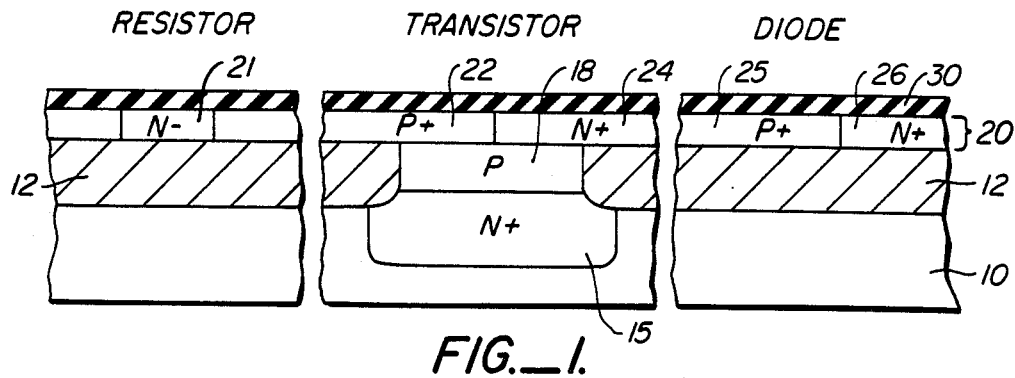
FIG._1.
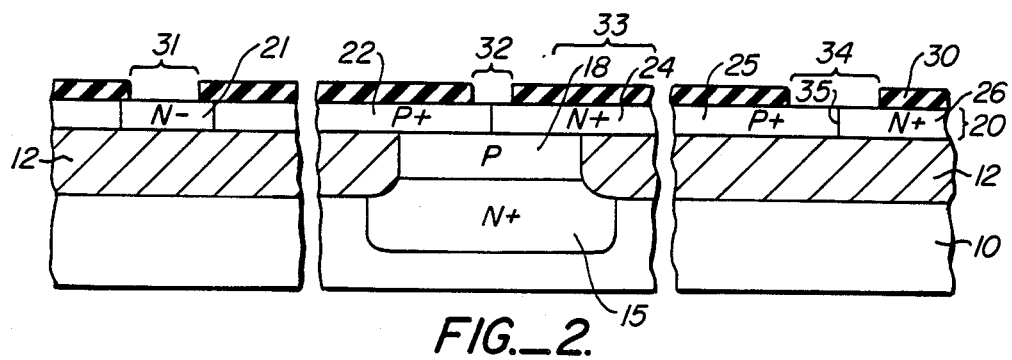
FIG._2.
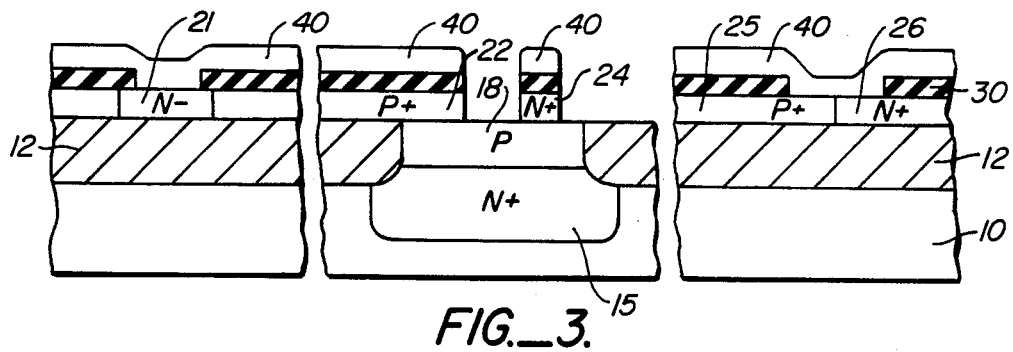
FIG._3.
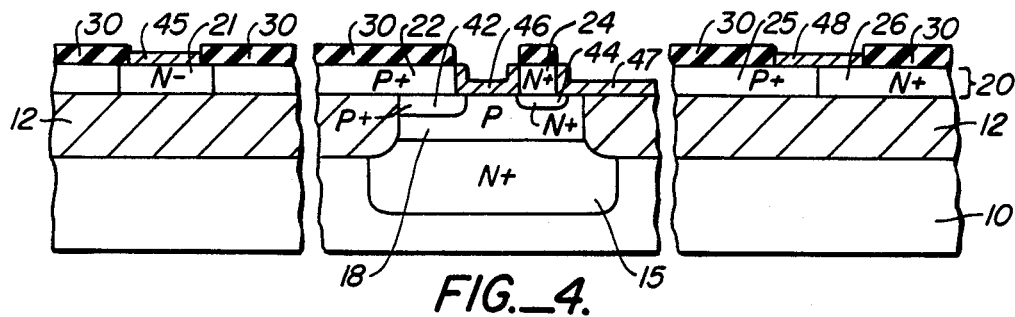
FIG._4.

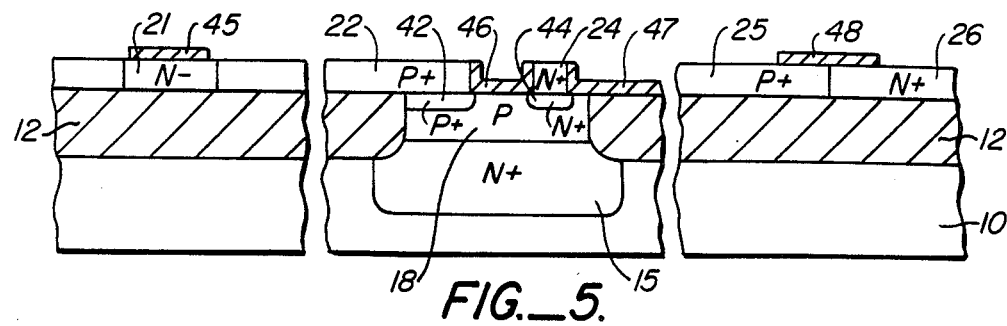
FIG._5.
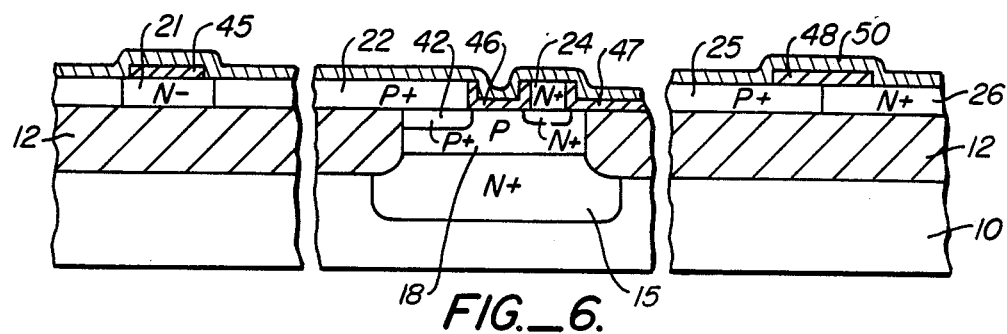
FIG._6.
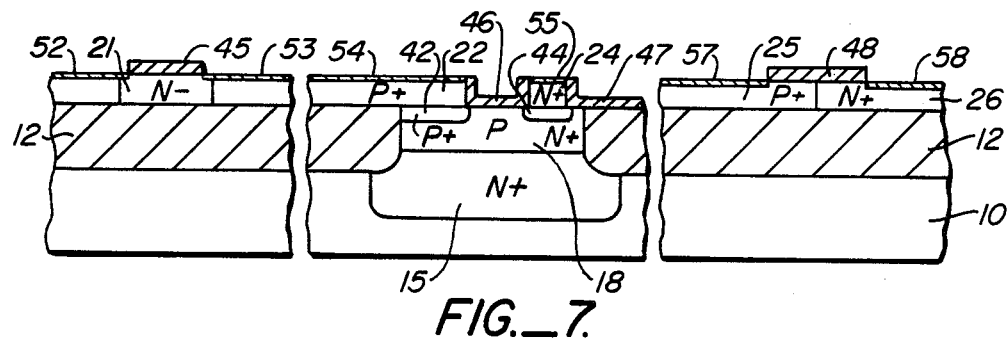
FIG._7.

SELF-ALIGNED METAL SILICIDE PROCESS FOR INTEGRATED CIRCUITS HAVING SELF-ALIGNED POLYCRYSTALLINE SILICON ELECTRODES

BACKGROUND OF THE INVENTION

1. Field of the Invention

This invention relates to integrated circuit fabrication processes, and in particular, to a method of providing self-aligned metal silicide layers on bipolar integrated circuits which circuits also include self-aligned polycrystalline silicon features such as electrodes.

2. Description of the Prior Art

The technology for fabricating bipolar integrated circuits has advanced dramatically in the past several years. Methods are now well-known for fabricating regions of oxidized semiconductor material to electrically isolate bipolar circuits fabricated in a single substrate. One such technique is taught by Douglas Peltzer in U.S. Pat. No. 3,648,125 entitled "Method of Fabricating Integrated Circuits With Oxidized Isolation and the Resulting Structure". That patent teaches a technique by which epitaxial pockets of semiconductor silicon may be electrically isolated by the formation of surrounding regions of oxidized semiconductor material in conjunction with underlying buried layers.

Also well-known are self-aligned polycrystalline silicon processes in which active device regions and contacts to such regions, as well as for other purposes, are formed by deposition of polycrystalline silicon over a substrate. Following the deposition suitable treatment, typically heating, causes impurities from the polycrystalline silicon to diffuse into the substrate to form regions, such as emitters, which have self-aligned doped polycrystalline silicon contacts. See, for example, "A New Polysilicon Process For a Bipolar Device-PSA Technology," by Okada et al., *IEEE Journal Of Solid-State Circuits,* Vol. SC-14, No. 2, April 1979, at page 307. A partially self-aligned MOS titanium silicide process is disclosed by Murao et al. in "A High Performance CMOS Technology with Ti-Silicided P/N-Type Poly-Si Gates," *IEEE International Electron Devices Meeting* 1983, pgs. 518–521.

Prior art processes for fabricating bipolar integrated circuits having self-aligned polycrystalline silicon electrodes and layers of metal silicide to provide interconnections, however, suffer from several disadvantages. First, because the dopant used to fabricate the base contact, emitter, and other regions, must be contained in the polycrystalline silicon if the polysilicon electrodes are to be self-aligned, the dopant is prone to migrate into the overlying layers of metal silicide during the thermal processes used to diffuse the dopant. Secondly, because such prior art processes do not provide metal silicide self-aligned to the polysilicon regions to be contacted, an etching step must be performed to remove undesired regions of metal silicide from the wafer. This step is not only undesirable because of the extra process complexity, but also because it leaves traces of unetchable conductive residues on the field oxide areas. These traces increase the emitter-base and collector-base junction leakages, thereby substantially degrading circuit performance. Furthermore, because such prior art processes typically required long annealing treatments to lower sufficiently the resistance of the fabricated metal silicide layers, metal oxidation and incorporation of oxygen into the silicide film were common occurrences.

It is therefore an object of this invention to provide a process for fabricating metal silicide layers on desired components of bipolar circuits which process is self-aligned to the components, which does not result in the movement of dopants from polysilicon into the silicide, which eliminates metallic contaminants from the surface of the field oxide surrounding active device areas, and which eliminates the need for etching the metal silicide.

SUMMARY OF THE INVENTION

This invention provides a process for fabricating self-aligned regions of metal silicide on bipolar integrated circuit structures which overcomes the above-mentioned difficulties of prior art processes. In a preferred embodiment the process of this invention includes the steps of depositing a layer of polycrystalline silicon across the upper surface of a semiconductor substrate, patterning the layer of polycrystalline silicon to form electrodes such as to contact ohmically emitters, base contacts, resistors, and diodes; heating the structure to cause impurity dopant in the polycrystalline silicon to diffuse into the semiconductor structure; protecting those portions of the structure where metal silicide is not desired; depositing metal across the structure; and reacting the metal with the underlying structure wherever metal silicide is to be formed. In the preferred embodiment the step of patterning the polycrystalline silicon layer includes depositing a layer of silicon nitride across a sheet of polycrystalline silicon, patterning the nitride layer, then using photoresist and the nitride layer to mask all of the polycrystalline silicon layer except those portions to be removed. Also in the preferred embodiment the step of protecting the regions where silicide is not desired comprises oxidizing those regions to form a protective layer of silicon dioxide.

BRIEF DESCRIPTION OF THE DRAWINGS

FIG. 1 is a cross-section of an integrated circuit structure upon which a layer of polycrystalline silicon and layer of silicon nitride have been deposited.

FIG. 2 is a subsequent cross-sectional view after definition of the layer of silicon nitride.

FIG. 3 is a subsequent cross-sectional view after removal of undesired regions of the layer of polycrystalline silicon.

FIG. 4 is a subsequent cross-sectional view after the injunction drive-in and oxidation of the exposed silicon surfaces.

FIG. 5 is a subsequent cross-sectional view after removal of the remaining silicon nitride.

FIG. 6 is a subsequent cross-sectional view after deposition of a layer of metal across the surface of the structure.

FIG. 7 is a subsequent cross-sectional view after reaction of the layer of metal with underlying regions of polysilicon to form metal silicide connections. The excess, unreacted metal is selectively etched off from oxide regions.

DETAILED DESCRIPTION OF THE PREFERRED EMBODIMENT

FIG. 1 is a cross-sectional view of a partially completed integrated circuit structure. The structure shown in FIG. 1 includes a monocrystalline silicon substrate 10 in which an n conductivity type buried layer 15 has been formed. An epitaxial silicon layer 18 has been deposited across the surface of substrate 10 and oxidized isolation regions 12 formed. Regions 12, 15, and 18 may be fabricated using well-known semiconductor process technology, for example, as set forth in the Peltzer patent above.

Across the upper surface of the structure a layer of polycrystalline silicon 20 of desired thickness is deposited, for example, using chemical vapor deposition technology. Using well-known photolithographic techniques, in conjunction with diffusion or ion implantation processes, desired conductivity impurities, such as arsenic, boron, or phosphorous, are introduced into layer 20 to dope desired regions of the layer. The particular pattern and arrangement of these doped regions will be dependent upon the desired active and/or passive devices to be fabricated in the epitaxial silicon 18 and in the polycrystalline silicon 20. For purposes of illustration FIG. 1 has been divided into thirds, and the application of the process of this invention will be described in conjunction with the fabrication of a resistor, a transistor, and a diode. The resistor, and electrical contacts thereto, are fabricated in the manner depicted in the left-hand third of each figure, while the diode, and the application of the process of this invention thereto, is depicted in the right-hand third of the figures. The center of each of FIGS. 1–7 is used to depict the fabrication of a transistor.

In FIG. 1 region 21 of layer 20 has been lightly doped with n conductivity type impurity to begin the fabrication of a resistor. Region 22 has been heavily doped with p conductivity type impurity and will provide an ohmic connection to a self-aligned transistor base contact fabricated beneath it. The base contact will enable an electrical connection to be made to region 18, which will become the base of a vertical npn transistor. N conductivity type region 24 will be used for the fabrication of a self-aligned emitter/emitter contact for the transistor. P type region 25 and n type region 26 together will provide a diode for the integrated circuit.

Across the entire upper surface of polycrystalline silicon 20 a layer of silicon nitride is deposited to provide an oxidation mask. In the preferred embodiment the nitride layer 30 is deposited using chemical vapor deposition to a thickness of about 1000 angstroms.

The structure is then masked using well-known photolithographic techniques and these undesired portions of layer 30 removed, as shown by FIG. 2. Silicon nitride layer 30 will be removed wherever an electrically conductive to-be-formed layer of metal silicide is *not* desired. For example, in FIG. 2 an opening 31 is created above region 21 because a silicide layer is not desired there (and if placed there would short out the to-be-formed resistor.) Finally, the nitride 30 is removed from region 34 to prevent fabrication of metal silicide in this region which would short pn junction 35 destroying the diode. At this point in the process the layer of polycrystalline silicon 20 is intact and extends across the entire upper surface of the integrated circuit structure. After formation of the mask, the silicon nitride is etched using well-known techniques.

As next shown in FIG. 3, a layer of photoresist 40 is deposited across the upper surface of the structure and removed from regions where underlying polycrystalline silicon is to be removed. The photoresist layer 40 will prevent etching of the polycrystalline silicon regions 21 as well as regions 25 and 26 otherwise exposed through opening 34. (The nitride is etched with $C_2F_6$ and helium plasma in a Sigma 80 reactor.) In addition, the resist 40 will serve to define the sheet of polycrystalline silicon 20 into a series of polycrystalline lines rather than a single sheet. The length of the lines runs in the direction of the width of the Figures, while the width of the lines extends into the page, perpendicular to both the thickness and length. In the preferred embodiment the polycrystalline silicon is etched in a LAM etcher using carbon tetrachloride and helium.

As next shown by FIG. 4, the structure is heated to diffuse impurity out of the polycrystalline silicon regions into to the underlying silicon. In FIG. 4 a base contact 42 has been formed in this manner beneath polysilicon 22, while an emitter 44 is formed beneath contact 24. The particular parameters of the thermal drive-in process will depend upon the desired characteristics of the resulting transistor. In one embodiment a temperature of 950° C. for 30 minutes has been found satisfactory. This process will also activate the dopants in the polycrystalline silicon and render it conductive. For example, prior to the thermal process the polycrystalline silicon will have essentially an infinite resistance, while afterward the resistance usually will be on the order of 50 ohms per square, depending upon the impurity concentration in the polysilicon 20.

Following the junction drive-in and removal of resist 40, and as also shown in FIG. 4, the structure is thermally oxidized to passivate the active areas and the sidewalls of the polysilicon lines 20. As shown in FIG. 4, a layer of silicon dioxide 45 is formed on the upper surface of resistor 21 and a layer of silicon dioxide 46 is formed on epitaxial silicon 18 and the sidewalls of polysilicon regions 22 and 24. Silicon dioxide 47 is formed on the other side of polysilicon 24, while silicon dioxide layer 48 is formed on the upper surface of the diode. Not shown in the figures, but formed at the same time, will be a layer of silicon dioxide along the exposed sides of the entire polysilicon line 20.

The remaining silicon nitride 30 is then removed to create the structure shown in FIG. 5. This silicon nitride may be removed by dipping the entire structure in hot phosphoric acid ($H_3PO_4$) at a temperature of about 150° C. This etch will not effect the polycrystalline silicon or the silicon dioxide.

As next shown by FIG. 6, a relatively thin layer of a refractory metal such as titanium, molybdenum or tungsten is deposited. The metal is deposited in a substantially pure form at a relatively low temperature, for example, using RF sputtering. In the preferred embodiment approximately 600 Angstroms of titanium are deposited.

The integrated circuit structure is then placed in a Heatpulse reactor, manufactured by A. G. Associates in Palo Alto, Calif. and heated in an nitrogen ambient for approximately 10 seconds to approximately 800° C. This process is described in more detail in U.S. patent application Ser. No. 634,937, now U.S. Pat. No. 4,567,058 entitled: Improved Method To Control Lateral Silicon Diffusion In A Self-Aligned $TiSi_2$ Process and filed the same date as this application. Both applications are commonly assigned to Fairchild Camera & Instrument Corporation. As a result of the heating, titanium silicide will be formed everywhere titanium 50 has been deposited on polysilicon, but will not be formed anywhere the metal has been deposited on silicon dioxide. Thus, the fabrication of titanium silicide regions on the semiconductor structure is self-aligned to the polycrystalline silicon regions underlying the silicide. By fabrication of the silicide using the technique described in the above-referenced co-pending application, silicon from the underlying polycrystalline silicon does not diffuse to any significant extent through the metal to create undesired regions of silicide. Because the combined volume of metal and polycrystalline silicon prior to the reaction is greater than the resulting volume of metal silicide, the silicide will tend to be inset into the underlying polycrystalline silicon, as shown by FIG. 7.

Following fabrication of the silicide, the remaining titanium is selectively etched away in a solution of ammonium hydroxide ($NH_4OH$) and hydrogen peroxide ($H_2O_2$) (1:3 by volume). The solution dissolves titanium but does not dissolve titanium silicide. The same solution can be used to remove unreacted tungsten if tungsten silicide is to be formed instead of titanium silicide. For a molybdenum silicide process, phosphoric acid ($H_3PO_4$) is used to dissolve unreacted molybdenum on oxide regions but not the molybdenum silicide. Following removal of the unreacted refractory metal, the structure is again heated to lower the sheet resistance of the silicide. In the preferred embodiment this is achieved by heating the structure to 900°–1000° C. for 10 seconds. As shown in FIG. 7, silicide regions 52 and 53 provide electrical connections to the lightly doped polysilicon region 21, thereby forming a resistor. Silicide region 54 is deposited upon base contact electrode 22 to provide a low resistance connection to base 18 via contact 42. Silicide 55 on emitter contact 24 provides a connection to emitter region 44. Silicide regions 57 and 58 provide electrical connections to the diode formed at the interface of polycrystalline silicon regions 25 and 26.

The structure shown in FIG. 7 may be subjected to further well-known integrated circuit processes to create additional layers of interconnections. For example, passivating material may be deposited across the entire upper surface of the integrated circuit, openings formed therein, and a layer of metal deposited thereon to provide connections to the silicide regions shown. The silicon dioxide regions 45, 46, 47, and 48 prevent inadvertent connections to resistor 21, base 18, and the diode 25/26.

The process of this invention permits fabrication of these critical circuit elements and integration of them into an integrated circuit without the disadvantages of prior art processes. In particular, the process of this invention minimizes the movement of dopants into the silicide from the polycrystalline silicon, which would occur if the junction drive-in step followed the silicide formation as in the prior art. Furthermore, the process eliminates the metallic contaminants which often led to high device leakage currents, by eliminating the need to etch the completed silicide layer. The very short time required to anneal the structure greatly reduces the risk of oxidizing any metal in the integrated circuit and prevents the incorporation of oxygen into the titanium silicide which was a common occurrence in conventional prior art processes.

The foregoing has been a description of the preferred embodiment. Although specific times, temperatures, thicknesses, and materials have been described, these are set forward to enable a full understanding of the invention, and are not intended to limit the invention. The scope of the invention may be ascertained from the appended claims.

We claim:

1. A process for fabricating metal silicide interconnections to polycrystalline silicon regions on a semiconductor structure, where some of the polycrystalline regions are of the type utilized to form self-aligned doped regions in a semiconductor substrate underlying the polycrystalline region, said process comprising:
   forming a laying of polycrystalline silicon containing impurity on the surface of a semiconductor substrate to form a resulting structure;
   forming regions of a first material on the surface of the polycrystalline silicon except over those portions where metal silicide is not desired on the polycrystalline silicon surface;
   patterning the polycrystalline silicon to form regions of polycrystalline silicon and to expose selected portions of the surface of the substrate;
   treating the structure to cause some of the impurity to diffuse into the semiconductor substrate from a first region of polycrystalline silicon to form a first doped region in the structure that is self-aligned with the first region of polycrystalline silicon;
   protecting the portions of the polycrystalline silicon regions which are not overlaid by said first material and the exposed portions of the substrate which are not overlaid by polycrystalline silicon by forming a protective coating over these portions;
   removing said regions of first material to expose the portions of the surface of the polycyrstalline silicon layer where the formation of silicide is desired;
   depositing a layer of a metal capable of reacting with silicon, with the metal layer deposited across the entire treated structure including over the protective coating and over the unprotected exposed portions of the polycrystalline silicon; and
   reacting the metal with the unprotected portions of the polycrystalline silicon but not with the protective coating to thereby form metal silicide interconnections to the unprotected portions of the polycrystalline silicon.

2. A process as in claim 1, wherein the step of patterning comprises:
   etching said first material with a desired pattern; and
   etching the polycrystalline silicon with said desired pattern.

3. A process as in claim 2, wherein said first material is an oxidation-resistant material and wherein the step of protecting comprises:
   oxidizing the structure except where overlaid by the oxidation resistant material; and
   removing the oxidation resistant material.

4. A process as in claim 3, wherein the protective coating comprises silicon dioxide.

5. A process as in claim 4, wherein the oxidation resistant material comprises silicon nitride.

6. A process as in claim 3, wherein the step of depositing a layer of metal comprises depositing one of titanium, molybdenum and tungsten.

7. A process as in claim 6, wherein the step of reacting comprises heating the metal to form metal silicide.

8. A process for fabricating metal silicide interconnections to polycrystalline silicon regions on a bipolar semiconductor structure comprising:
   depositing a layer of polycrystalline silicon across the semiconductor structure;
   introducing desired conductivity type impurity into the polycrystalline silicon layer;
   coating the polycrystalline silicon layer with a layer of silicon nitride to form a protecting layer;

removing first regions of silicon nitride wherever metal silicide interconnections are not desired on the surface of the polycrystalline silicon;

patterning the layer of polycrystalline silicon;

heating the structure to cause some of the impurity in the polycrystalline silicon layer to diffuse into the semiconductor structure thereby creating self-aligned doped regions in the structure;

oxidizing the previously heated semiconductor structure to form a protective coating of silicon dioxide wherever the semiconductor structure is not overlaid by polycrystalline silicon and wherever silicon nitride does not overlay the polycrystalline silicon;

removing all of the remaining protecting portions of the layer of silicon nitride to form unprotected portions of the surface of the polycrystalline silicon;

depositing a layer of a metal capable of reacting with the polycrystalline silicon, with the metal layer deposited across the entire previously heated structure, including over the silicon dioxide and over the unprotected portion of the surface of the polycrystalline silicon;

reacting the metal with the polycrystalline silicon but not with the silicon dioxide to thereby form metal silicide interconnections to the polycrystalline silicon; and removing the unreacted metal.

* * * * *